(12) United States Patent
Tai et al.

(10) Patent No.: US 6,436,229 B2
(45) Date of Patent: Aug. 20, 2002

(54) GAS PHASE SILICON ETCHING WITH BROMINE TRIFLUORIDE

(75) Inventors: Yu-Chong Tai, Pasadena; Xuan-Oi Wang, Los Angeles, both of CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 09/741,403

(22) Filed: Dec. 19, 2000

Related U.S. Application Data (63) Continuation of application No. 09/010,945, filed on Jan. 22, 1998, now Pat. No. 6,162,367.
(60) Provisional application No. 60/035,307, filed on Jan. 22, 1997.

(51) Int. Cl.$^7$ ................................................ B44C 1/22
(52) U.S. Cl. .................... 156/345; 438/707; 438/735; 438/739
(58) Field of Search ................................ 216/2, 79, 707; 438/719, 735, 964, 739; 156/345 V, 345 P, 345 L (56) References Cited

U.S. PATENT DOCUMENTS

| | | | |
|---|---|---|---|
| 4,310,380 A | 1/1982 | Flamm et al. ............... | 156/643 |
| 4,498,953 A | 2/1985 | Cook et al. .................. | 156/646 |
| 4,695,700 A | 9/1987 | Provence et al. ........... | 219/121 |
| 4,749,440 A | 6/1988 | Blackwood et al. ........ | 156/646 |
| 5,767,021 A | * 6/1998 | Imai et al. ................... | 438/719 |
| 5,874,362 A | * 2/1999 | Wong et al. ................. | 438/719 |
| 6,162,367 A | * 12/2000 | Tai et al. ..................... | 216/2 X |

FOREIGN PATENT DOCUMENTS

| | | | |
|---|---|---|---|
| EP | 0 704 884 A2 | 4/1996 | ........... H01L/21/31 |

OTHER PUBLICATIONS

D.E. Ibbotson, et al., "Plasmaless Dry Etching of Silicon with Fluorine–Containing Compounds"; J. Appl. Phys., Nov. 15, 1984; vol. 56, No. 10, pp. 2939–2942, sections II, III.B.2.

\* cited by examiner

*Primary Examiner*—William A. Powell
(74) *Attorney, Agent, or Firm*—Fish & Richardson P.C.

(57) ABSTRACT

An apparatus and method for gas-phase bromine trifluoride ($BrF_3$) silicon isotropic room temperature etching system for both bulk and surface micromachining. The gas-phase $BrF_3$ can be applied in a pulse mode and in a continuous flow mode. The etching rate in pulse mode is dependent on gas concentration, reaction pressure, pulse duration, pattern opening area and effective surface area.

21 Claims, 9 Drawing Sheets

1 Torr BrF₃ + 99 Torr Xe
FIG. 10B

1 μm

1 Torr No Dilution
FIG. 10A

GAS PHASE SILICON ETCHING WITH BROMINE TRIFLUORIDE

This is a continuation of U.S. application Ser. No. 09/010,945, filed Jan. 22, 1998, now U.S. Pat. No. 6,162,367.

This application claims benefit under 35 USC 119(e) of the U.S. Provisional Application No. 60/035,307 filed on Jan. 22, 1997, the entirety of which is incorporated herewith by reference.

FIELD OF THE INVENTION

This disclosure relates to pulsed gas-phase silicon etching in micromachining processes. More specifically, etching using $BrF_3$ is described.

BACKGROUND

Etching is used to form features during silicon micromaching in micro-electromechanical systems ("MEMS"). The success of etching processes are characterized by the etch rate in dimensions of thickness per unit time. The etch rate has dimensions of thickness per unit time. A high etch rate is generally desired. However, too high an etch rate may render a process difficult to control. Common desired etch rates are in units of hundreds or thousands of angstroms per minute. Selectivity is the ratio of the etch rates of silicon referenced to the etch rate of the mask film being patterned on top of silicon. A particular process may be quoted as having a selectivity of 300 to 1, polysilicon over oxide. This means that polysilicon etches 300 times faster than oxide. Another consideration when characterizing etching performance is producing isotropic etches. Isotropic etches, meaning etches having uniform etch properties in all directions, are desirable.

Silicon micromachining in MEMS often uses wet chemical and plasma etching. Wet chemical etching is a purely chemical process having three steps: movement of the etchant species to the surface of the wafer, chemical reaction with the exposed film that produces soluble byproducts, and movement of the reaction products away from the surface of the wafer. Wet etching often yields high selectivity. However, wet etching can have serious drawbacks such as poor process control and excessive particle contamination. Chemical etchants also can cause surface tension effects during drying. The meniscus force of the liquid etchant can drag on the free standing structure thereby sticking to the structure's surface which can induce direct mechanical damage.

Etching in a plasma environment has several advantages when compared to wet etching. Plasmas are easier to start and stop at precise times defining the beginning and end respectively of the etching process as compared with simple immersion wet etching. Plasma etch processes are much less sensitive to small changes in the temperature of the wafer. Plasma etching involves less contaminant and no damage to fragile structures due to surface tension and stiction forces of wet etchants.

Plasma etching is carried out by introducing a feed gas into the chamber. The feed gas is broken down into chemically reactive species by the plasma. These chemically reactive species diffuse to the surface of the wafer and are adsorbed. The species react with the exposed film. The reaction product is desorbed, diffused away from the wafer, and is transported by gas stream out of the etch chamber.

Plasma etch processes obviate many of the wet chemical etch problems. However, plasma etching has limited selectivity over silicon dioxide and nitride. The plasma environment also produces ions and soft x-ray radiation which can damage or have undesirable charging effects on the electronic devices on the substrate.

In "Plasma-less Dry Etching of Silicon with Fluorine-containing Compounds", Lbbotson et al, J. Appl. Phys., Vol. 56(10), 1984, p. 2939–2942; it was suggested that some fluorine-containing interhalogens such as xenon difluoride can etch silicon spontaneously in the vapor phase.

SUMMARY

The present invention provides an apparatus and method for gas-phase bromine trifluoride ($BrF_3$) silicon isotropic room temperature etching system for both bulk and surface micromachining. Gas-phase $BrF_3$ etching has many advantages. $BrF_3$ has a high vapor pressure at room temperature. This allows ease of use and high etching rate. Gas-phase $BrF_3$ etching produces fewer damaging meniscus and stiction forces and is relatively contamination-free. Gas-phase $BrF_3$ etching produces longer undercut distance than plasma etching and produces no damage to the electronics device on the substrate.

The $BrF_3$ containing gas-phase etchant can be applied in a pulse mode and in a continuous flow mode. The $BrF_3$ gas can be diluted with another gas and this mixture can be used as the gas-phase etchant. The etching rate in pulse mode is dependent on gas concentration, reaction pressure, pulse duration, pattern opening area and effective surface area.

An apparatus and method for $BrF_3$ containing gas-phase etching is provided.

BRIEF DESCRIPTION OF THE DRAWING

These and other aspects will be described with reference to the drawings, in which.

DESCRIPTION OF THE PREFERRED EMBODIMENTS

Etching Chemistry

The literature does not suggest any efficient methods and apparatus of using $BrF_3$ gas for silicon micromachining. At room temperature, $BrF_3$ is in the form of a colorless to gray yellow liquid with a vapor pressure of approximately 7.0 Torr. When compared with xenon difluoride ($XeF_2$), bromine trifluoride is easier to vaporize. $XeF_2$ has a vapor pressure of approximately 3.0 Torr and exists as a white power at room temperature. $BrF_3$ exists as a liquid at room temperature. This is advantageous since the etchant can be stored as a liquid. Liquids are usually easier to store in process chambers and to vaporize than solid powder. $BrF_3$ has more fluorine atoms than $XeF_2$ per molecule. Hence, $BrF_3$ has a higher etching efficiency than that of $XeF_2$ because fluorine atoms are believed to be the active etching molecule. $BrF_3$ etching is also cost effective when compared with the use of $XeF_2$. The cost of $BrF_3$ etching can be as low as 10% of the cost of $XeF_2$ etching.

The etching mechanism of gas-phase $BrF_3$ with silicon is believed to be similar to that of other fluorine-containing interhalogens. The mechanism is believed to include: (1) nondissociative adsorption of gas-phase species at the surface of the solid being etched; (2) dissociation of this adsorbed gas; (3) reaction between adsorbed atoms and the solid surface to form an adsorbed product molecule ($SiF_4$); (4) desorption of the product molecule into the gas phase. Adsorption is the adhesion of an extremely thin layer of molecules to the surfaces of solid bodies with which the molecules are in contact. Desorption is the release of product molecules from a surface.

Pure $BrF_3$ gas can be used as a gas-phase etchant. A mixture of $BrF_3$ with another compound can also be used as a gas-phase etchant. One embodiment features diluting $BrF_3$ with xenon gas to control the etching surface roughness produced.

The etching of silicon on the surface is believed to be done by fluorine atoms. The volatile products, $SiF_4$ and $Br_2$, are produced as shown in equation (1):

$$4BrF_3 + 3Si = 2Br_2 + 3SiF_4 \quad (1)$$

Assuming the etching process is limited by chemical reaction and the $BrF_3$ concentration is uniform in the reaction chamber, the number of $BrF_3$ molecules in the reaction chamber, N, can be expressed as equation (2), $$-\frac{dN}{dt} = \frac{4}{3} RA \times n_{si} \quad (2)$$

where R is the silicon etching rate in angstrom/minute, $n_{si}$ is the atomic density of silicon, and A is the silicon opening area of the etching sample.

The $BrF_3$ etching rate is shown as a function of silicon substrate temperature and fitted to the Arrhenius equation in the form of equation (3), $$R = 1.16 \times 10^{-18} \frac{N}{V} T^{1/2} \mathrm{Exp}(-E_a/kT) \ (\text{Å/minute}) \quad (3)$$

where $E_a$ is the activation energy that has a value of $-6.4$ kcal/mole for $BrF_3$ at room temperature, k is the Boltzmann constant ($1.987 \times 10^{-3}$ kcal/mole/K). In the preferred embodiment, T is 300K, V is 2220 cm$^3$, the initial value of N is $7.76 \times 10^{19}$.

At 1.0 Torr gas pressure and room temperature, equation (3) gives an etching rate of 4.13 $\mu$m/min in the preferred system.

By combining equation (2) and equation (3) and solving the first-order differential equation, the number of $BrF_3$ molecules in the reaction chamber, N, is found to be an exponential function of time. N can be converted to the silicon mass loss as a function of etching time, M(t) as in equation (4), $$M(t) = M(\infty)\left[1 - \mathrm{Exp}\left(-\frac{t}{\tau}\right)\right] \quad (4)$$

where $\tau$ is shown in equation (5), $$\tau = C\frac{V}{A} \ (\text{second}) \quad (5)$$

C is a constant and has a value of $8.78 \times 10^{-2}$ s/cm for the present system. Equation (5) shows that the time constant is inversely proportional to the silicon exposed area A. For the opening area of 3 cm$^2$, equation (5) gives a time constant of 65 seconds.

Etching Apparatus and Operation

Figure 1A:
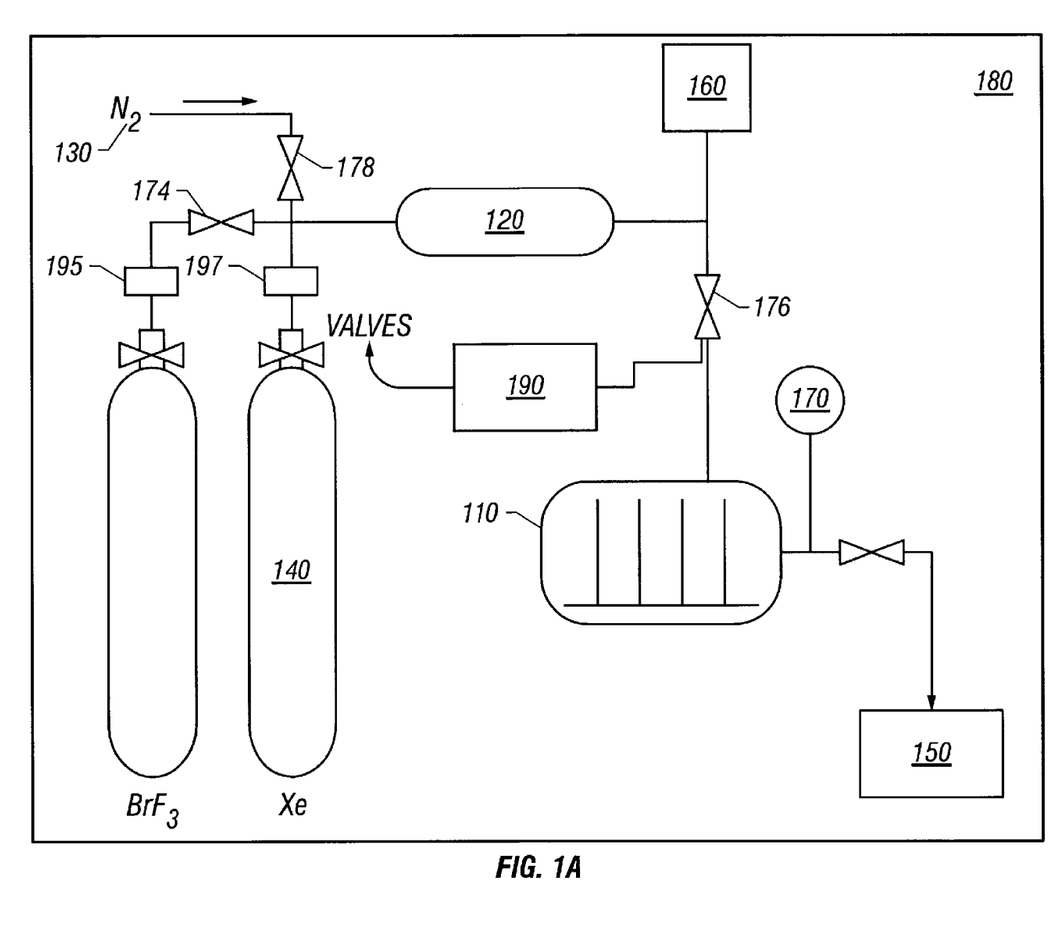
FIG. 1A shows a preferred etching apparatus.

FIG. 1A shows the preferred etching apparatus having a reaction chamber 110, a vapor reservoir 120, nitrogen purge source 130, xenon dilution system 140 and a vacuum subsystem 150. Individual gas flow is controlled by switching the corresponding valve 174, 178.

Valve 176 regulates the flow of gas from the vapor reservoir 120 to the reaction chamber 110. Valve 172 regulates the flow of gas from the reaction chamber 110 to the vacuum subsystem 150. Pressure in the vapor reservoir 120 and reaction chamber 110 are monitored by a pressure sensor, e.g., baratron 160 and a pressure gauge 170 respectively.

The vapor reservoir 120 is used to contain certain vapors prior to introduction into reaction chamber 110. Gases are held at the vapor reservoir 120 to control dilution concentration. The vapor reservoir is coupled to the reaction chamber. A 1900 cc reaction chamber 110 and a 320 cc vapor reservoir 120 can process approximately ten 4 inch wafers. The size of the chamber and reservoir are modified to accommodate the amount and size of the wafers to be processed.

In one embodiment, the reaction chamber 110, vapor reservoir 120, the interconnecting pipes, valves and any other part of the apparatus that may come in contact with $BrF_3$ is covered with a layer of corrosive resistant coating. Preferably, a thin layer of Parylene-C polymer film is deposited by chemical vapor deposition at room temperature. Parylene is chemically inert and prevents $BrF_3$ corrosion of the construction materials. The organic interior coating will give increased hydrophobicity to the apparatus thereby preventing undesirable condensation of gas onto the apparatus surfaces. Polyimide is another organic material that can be used as corrosive-resistant coating. Parylene-C is preferred because Parylene-C is easily applied to the apparatus by chemical vapor deposition at room temperature.

Nitrogen purge 130 is used to introduce nitrogen gas which removes contaminants and water from the wafer surface.

A xenon dilution system 140 is used to dilute the amount of $BrF_3$ used in the reaction. A preferred dilution ratio is 1 Torr of $BrF_3$ to 99 Torr of pure xenon gas. The inventors found that $BrF_3$ has a very high reaction rate which may produce uneven etches due to a diffusion limited effect. The diffusion limited effect is defined as when a reaction is limited by the time the molecules come in contact with the surface rather than the amount of reactants. Hence, some molecules may reach the surface faster than others producing an uneven etch. Dilution with xenon reduces the mean free path, as a result, $BrF_3$ molecules are scattered more uniformly at a higher reaction pressure thereby resulting in a smoother surface.

Baratron 160 is a sensitive, short range, pressure measuring device. The baratron measures a capacitance change when the pressure changes. The baratron is used in this embodiment to measure pressure changes within a 10 Torr range. The baratron is used as a vapor pressure sensor, positioned to measure a pressure of the vapor reservoir 120. The pressure gauge 170 is a wide range pressure dial which is used to measure a range from 0 to 500 Torr in this embodiment. The pressure gauge 170 is used as a reaction pressure sensor positioned to measure a pressure of the reaction chamber 110.

The construction materials are preferably stainless steel, brass, and nickel. A more costly material such as monel can also be used. Monel is more $BrF_3$ corrosive-resistant than stainless steel and brass. Other $BrF_3$ corrosive-resistant materials can also be used. The inventors found a method to improve the corrosive-resistant properties of less expensive metals, e.g. stainless steel and brass, by the application of Parylene-C polymer film. This corrosive-resistant coating enables the use of less expensive metals as construction materials by making these metals more $BrF_3$ corrosive-resistant.

For safety reasons, the whole apparatus system is set up inside a ventilated fume hood 180. The process can be automated in which case controller 190 can control the valves. Alternatively, the entire process can be manual.

The inventors found that the characteristics of $BrF_3$ gas are different than other etchants which have been used. In order to exploit these characteristics, etching processes are preferably conducted using pulse $BrF_3$ flow etching. Alternately, continuous flow of $BrF_3$ vapor can also be used. The apparatus as shown in FIG. 1A can be adapted for continuous flow operation. Mass flow controls 195, 197, are positioned to regulate the continuous flow rate of $BrF_3$ and Xe respectively during continuous flow operation.

However, such continuous flow of $BrF_3$ vapor will etch silicon very fast which makes the etching difficult to control. Also, continuous $BrF_3$ flow has a low etching efficiency. Continuous flow of $BrF_3$ leaves a significant amount of unconsumed $BrF_3$ vapor; this vapor can enter the pump system and may cause safety concerns and pump corrosion.

The etching process begins by loading the wafers in the reaction chamber 110. Vacuum subsystem 150 is used to evacuate both the reaction chamber 110 and vapor reservoir 120 to below 10 mTorr. The pressure of the reaction chamber 110 can be read from pressure gauge 170. The chamber separation valve 172 is then closed. Valve 174 is opened to inject a fixed amount of $BrF_3$ into the vapor reservoir 120, e.g., around $10^{-4}$ moles of material, depending on amount of samples to be processed. For a load of five 4 inch wafers, 7 Torr of $BrF_3$ are preferably used. The chamber separation valve 176 is then opened to allow $BrF_3$ vapor to enter the reaction chamber 110. Enough time is given to make sure all the $BrF_3$ vapor inside the reaction chamber 110 is consumed. This reaction time is dependent on the number and size of the wafer being processed. Finally, the chamber separation valve 172 is opened and both the reaction chamber 110 and vapor reservoir 120 are again pumped down. The above procedures define one pulse of the etching process. The process is continued for each pulse.

Figure 1B:
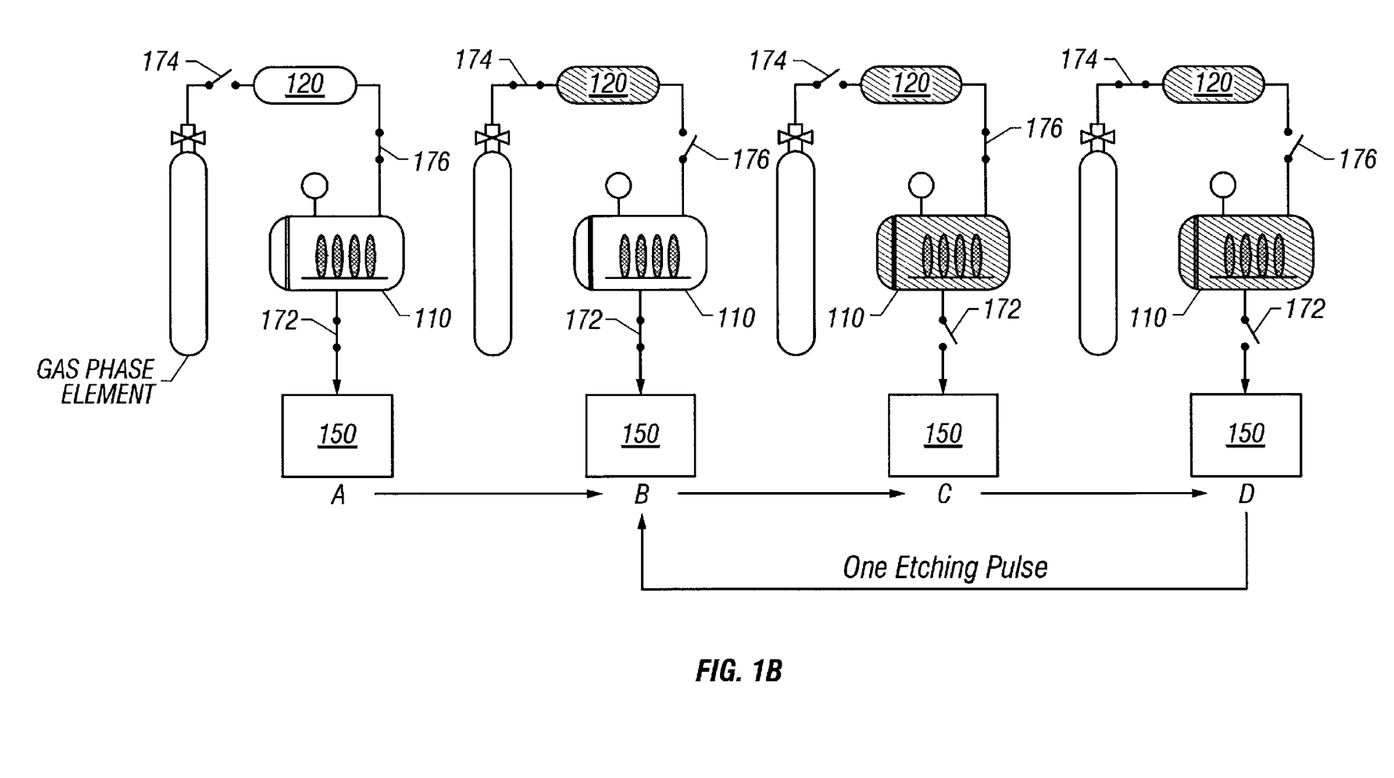
FIG. 1B shows the steps in one etching pulse.

FIG. 1B summarizes the steps in one etching pulse. In step A, valves 176 and 172 are opened and valve 174 is closed. The open valves 176 and 172 allow the vacuum subsystem 150 to evacuate the vapor reservoir 120 and the reaction chamber 110. Step B introduces the gas-phase etchant into the vapor reservoir. Valve 174 is opened to allow the gas-phase etchant to fill vapor reservoir 120. Valve 176 is closed to prevent the gas from vapor reservoir 120 to fill reaction chamber 110. In step C, valve 176 is opened to allow the gas-phase etchant from the vapor reservoir 120 to fill the reaction chamber 110. The valves 174 and 172 are closed to prevent escape of the gas-phase etchant. Step D closes valve 176 and valve 172, thereby isolating a controlled gas-phase etchant atmosphere inside the reaction chamber 110. Step D lasts for a duration sufficient for all of the gas-phase etchant to be consumed. Another pulse is applied by repeating steps B to D.

At room temperature and 6 Torr pressure in the vapor reservoir 120, the number of $BrF_3$ molecules in one pulse is calculated to be around $1.29 \times 10^{-4}$ mole. When the atmosphere in the vapor reservoir equalizes with reaction chamber 110, there is $1.1 \times 10^{-4}$ mole of $BrF_3$ in the reaction chamber 110. According to the equations (1) to (5), theoretically up to 2.3 mg of silicon can be etched away per pulse.

Sample Preparation

Silicon etching processes are conducted on silicon dice with edges covered by hard baked photoresist, which is shown later to have a very low etching rate. The material is first prepared to remove the native oxide on the silicon surface. The samples are etched in buffered hydrofluoric acid for 10 seconds followed by deionized water rinse and nitrogen drying before etching. This removes the native oxide on the silicon surface. This cleaning step removes the native oxide so that the $BrF_3$ can react with the silicon surface directly when introduced in the reaction chamber 110. Without the cleaning step, $BrF_3$ vapors are sufficient to remove the native oxide. Once the $BrF_3$ removes the native oxide then the etchant will proceed to etch the silicon surface.

Samples are then loaded into the reaction chamber 110 which is evacuated to 10 mTorr. The samples are then dried. A vacuum is applied to vaporize the moisture on the sample surface. Samples are maintained under vacuum for at least 10 minutes before starting the first $BrF_3$ pulse. This process time under vacuum is also dependent on the size and amount of wafers to be processed. Nitrogen gas is then applied to blow away any residual moisture and contaminants before starting the first $BrF_3$ pulse. Nitrogen valve 178 and chamber separation valve 176 are opened to introduce the nitrogen gas.

Nitrogen gas ($N_2$) drying produces reliable and repeatable etching. Baking the sample at high temperature for drying can also be done but is not necessary. Acetone cleaning is undesirable. A white polymer-like film forms on the silicon surface when acetone residue is exposed to $BrF_3$ vapor. This white film is undesirable because the film stops further etching.

The etching depth and the undercut can be measured, e.g. using a microscope with a calibrated focus. The thickness of the mask layers before and after the etching is determined using a Nanospec thin-film thickness measurement instrument, available from Nanometrics, Sunnyvale, Calif. The roughness of the silicon surface is measured using a surface profiler preferably a Tencor α-step 200(TM) available from Tencor Instruments. SEM photographs of surface roughness can be taken; surface roughness are measured by scales on the SEM photograph.

Etching Characterization and Performance
Bulk Silicon Etching

A first example carries out bulk silicon etching processes on silicon chips with circular openings. Single-crystal silicon, Polysilicon, and amorphous silicon have all been etched effectively using $BrF_3$ containing gas-phase etchant. The diameter ranges from 4 m to 4 mm; other diameters can also be used. Different masking materials such as thermal oxide, LPCVD silicon nitride, hard-baked AZ4400 and AZ1518 photoresist are used as the mask materials to characterize the etching rate and etching selectivity.

Figure 2:
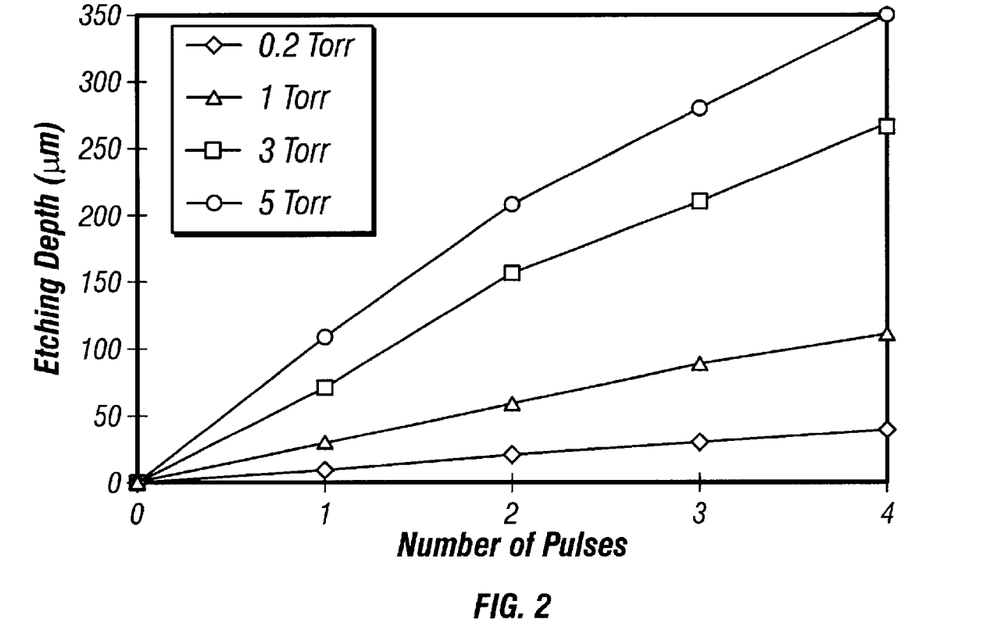
FIG. 2 illustrate's etching rates at different $BrF_3$ pressures.

The etching rate of one constant sample opening with variable gas pressures and constant pulse duration is measured. The samples have 800 $\mu$m circular window openings and the constant pulse duration is 10 minutes. FIG. 2 shows the vertical etching depth as a function of the number of pulses at different $BrF_3$ pressures. The etching rate ranges from 10 $\mu$m/pulse up to 140 $\mu$m/pulse, which correspond to an average etching rate range from 1 $\mu$m/min up to 14 $\mu$m/min for this particular opening of 800 $\mu$m. The vertical etching depth increases as the number of pulses applied increases.

Figure 3:
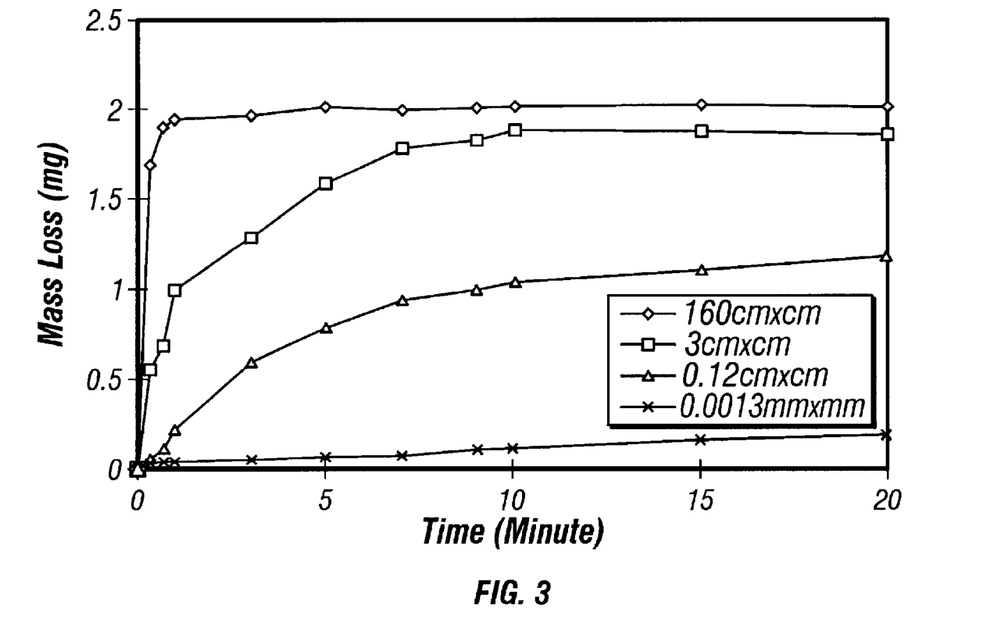
FIG. 3 illustrates silicon mass loss vs. pulse duration time for different exposed silicon areas.

The amount of sample etched under various pulse durations is measured. The $BrF_3$ pressure is constant at 1 Torr while the pulse duration time is varied from 20 seconds to 20 minutes. FIG. 3 shows the mass of silicon etched away versus pulse duration time with different window opening areas. The samples with different openings are tested separately. FIG. 3 shows that not only the etching rate but also the system etching efficiency is a function of exposed silicon area. The system efficiency is defined as the ratio of the silicon mass etched by the system to the theoretical silicon mass etched assuming all the $BrF_3$ is consumed by silicon, which is 2.3 mg in the preferred system. The efficiency from FIG. 3 is 80% for a 4 inch (160 cm$^2$) bare silicon wafer.

The etching rate as the function of the opening area is measured. Circular openings with diameters from 4 $\mu$m to 4 mm are used. All the samples are etched in the same load. The $BrF_3$ pressure is 1 Torr and the pulse duration is 15 minutes. The etching depth and undercut of these samples versus the sample opening area are plotted in FIG. 4.

Figure 4:
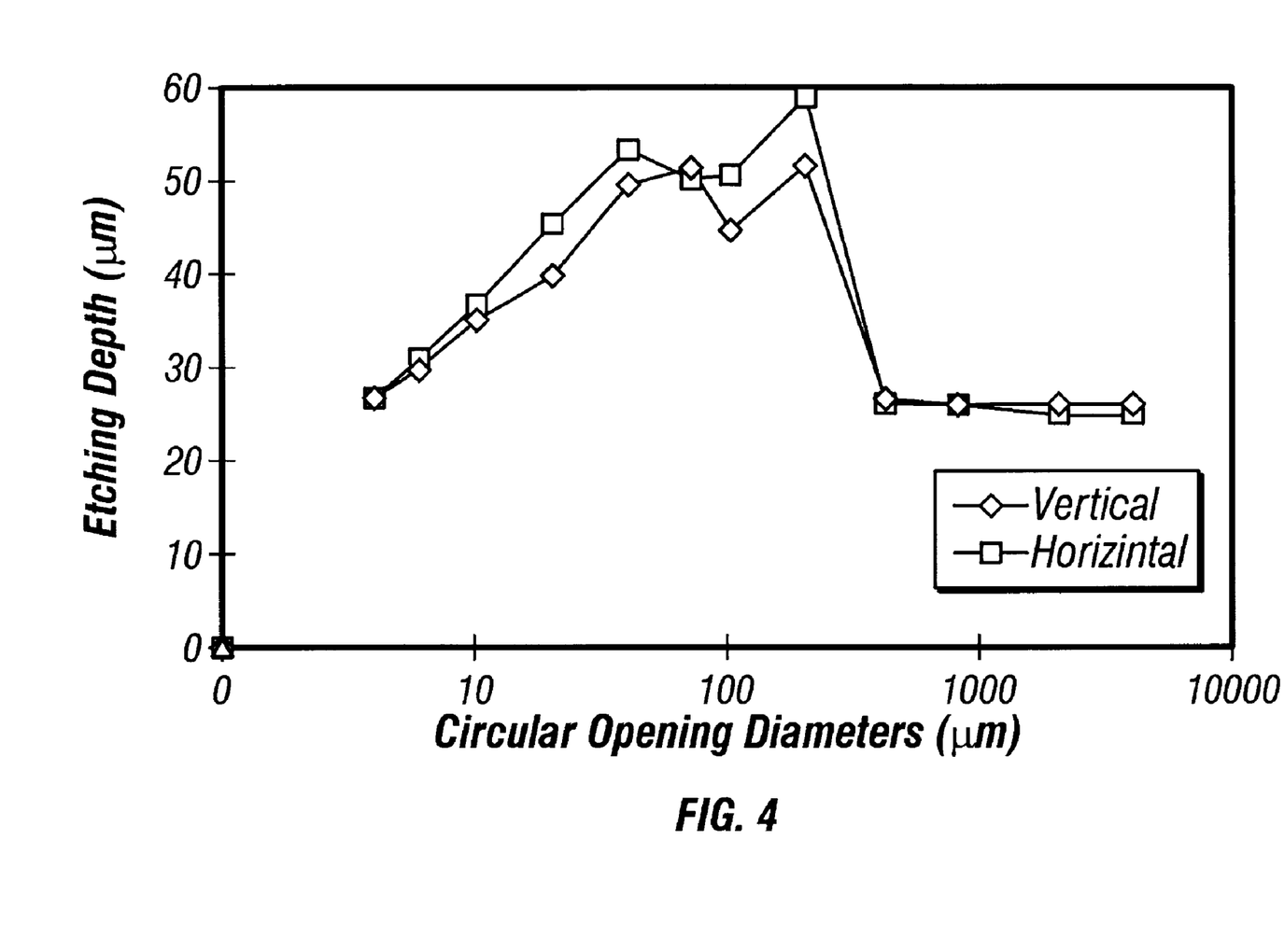
FIG. 4 illustrates vertical and horizontal etching depth vs. Circular opening with varying diameters.

FIG. 4 shows that the etching depth of the 40 $\mu$m to 200 $\mu$m samples are about 50% more than the larger samples. For the samples with diameters under 40 $\mu$m, smaller openings allow less silicon to be etched. Another series of samples are processed with the same type of samples using 500 mTorr, and 15 consecutive pulses at 1 min./pulse. All the samples are etched at the same time. The results shown in FIG. 5 agrees with the results of FIG. 4.

Equation (5) shows that the etching time constant τ is inversely proportional to the surface area. The bulk etching process results in FIG. 3 indicate such a qualitative relationship. Since the $BrF_3$ etched silicon surface is quite rough, the effective silicon surface area is larger than the mask opening area A.

Figure 5:
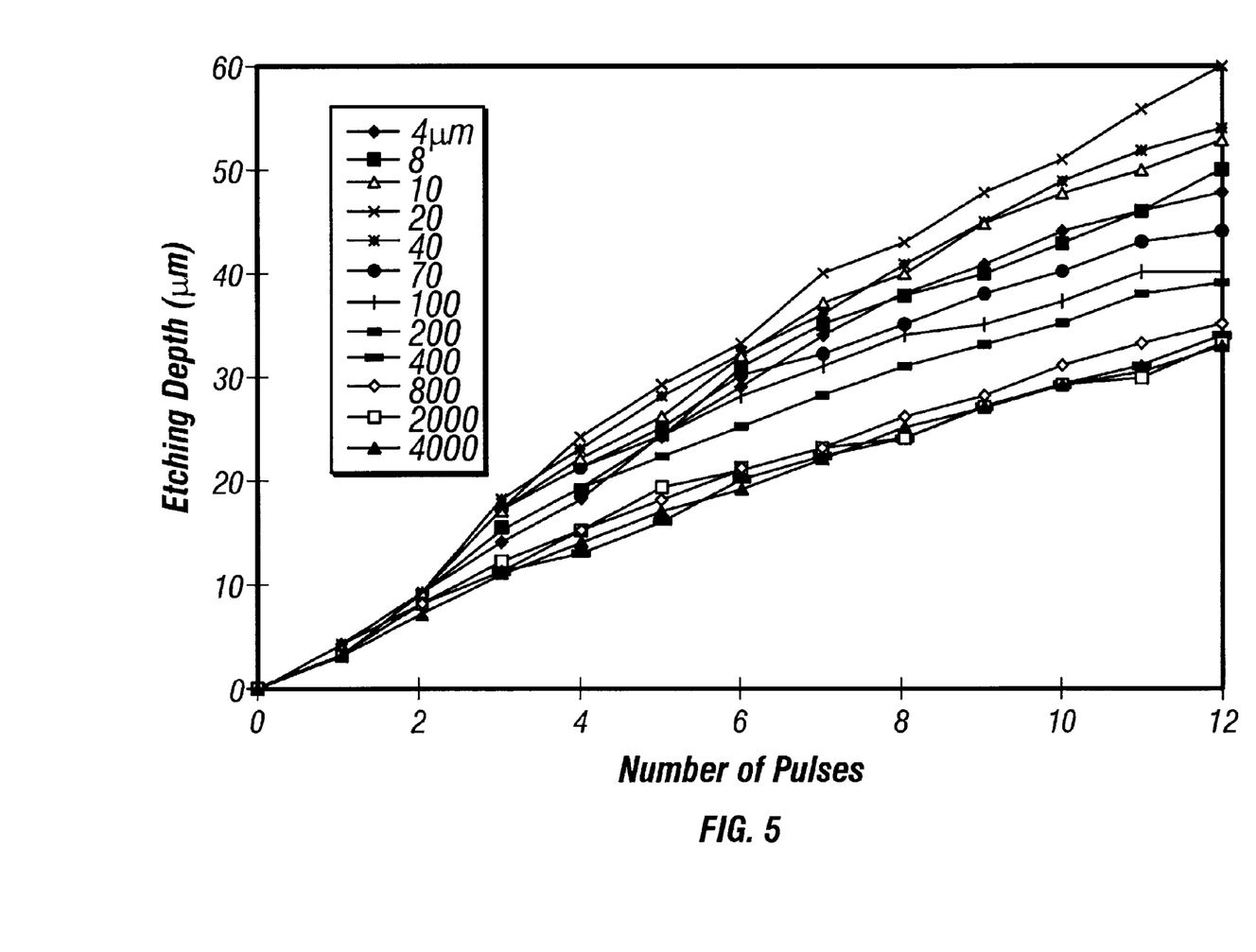
FIG. 5 illustrates vertical etching depth vs. number of pulses with different circular opening sizes.

The bulk silicon etching results in FIG. 4 and FIG. 5 illustrate the local loading effects for large openings, e.g. openings greater than 200 $\mu$m in diameter. Aperture opening effects are also shown for small openings, e.g. those under 10 $\mu$m in diameter. These two effects can be caused by the formation of a local $BrF_3$ depletion region.

Figure 6:
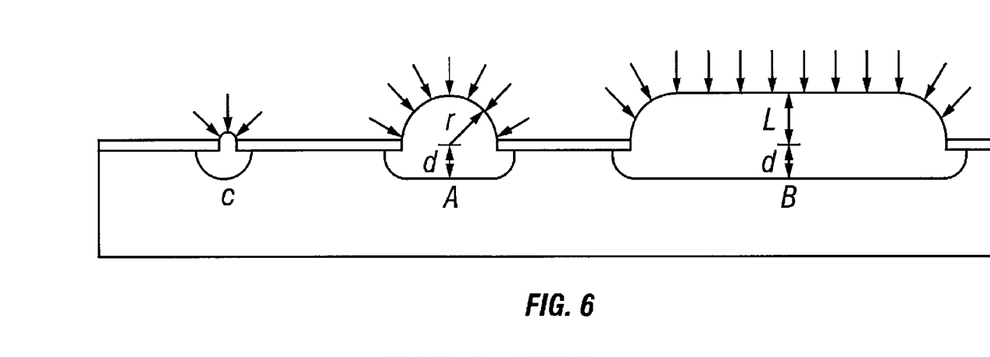
FIG. 6 shows local loading effect and aperture opening effect.

The diffusion limited effects can be qualitatively explained by comparing the circular opening radius with the mean free path L of the gas molecules. When the opening radius r is close to L, the diffusion front profile can be represented by a semi-spherical surface with radius r, shown as opening A in FIG. 6, which has a surface area of $2\Pi r^2$. If r>>L, as in the case of opening B, it has a surface area of $\Pi r^2$, which means the number of $BrF_3$ molecules that reaches the silicon surface per unit area without any collision with other gas molecules is half of the case A. This explains why the etching depth per pulse in B is half that of A as shown in FIG. 4. In the case of opening C, after etch down a depth of d, when d>2r, and r<<L, the opening that allows $BrF_3$ molecules enter is reduced compare to the case of r similar to d, thus reducing the etching rate.

Etching Selectivity

Checkerboard openings of 800 $\mu$m×800 $\mu$m on a silicon wafer with several masking materials are processed to characterize the etching selectivity. The etching selectivity of silicon to other materials is found to be greater than 3000 to 1 for LPCVD silicon dioxide, and 1000 to 1 for hard baked AZ 4400 and AZ1518 photoresists. The etching rate of silicon nitride depends on the quality and silicon concentration of the nitride layer and results in a selectivity range of 400:1 to 800:1. In the case of most metals, like aluminum, copper, gold, and nickel, $BrF_3$ forms a passivated non-volatile metal fluoride layer on the metal surface and further reaction is stopped. The selectivity over these metals is greater than 1000 to 1. The selectivity of silicon to Polyimide is greater than 1000 to 1. The selectivity of silicon to Parylene-C polymer film is greater than $10^4$ to 1.

Polysilicon Sacrificial Layer Etching

Figure 7:
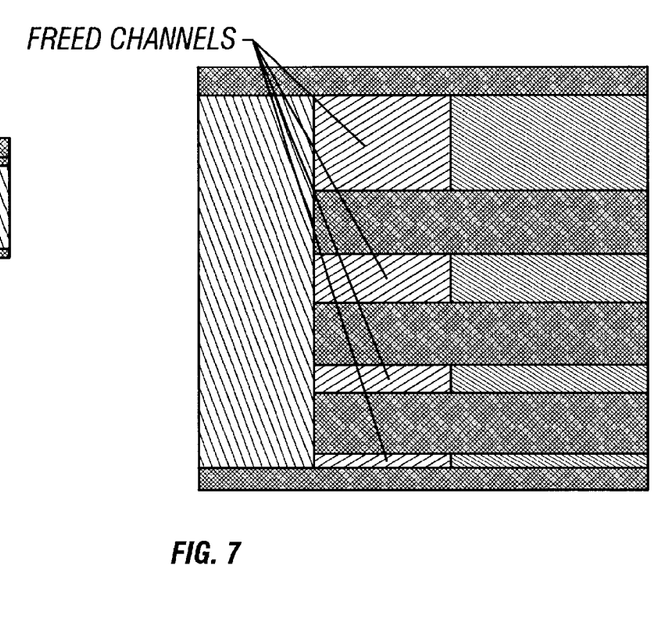
FIG. 7 illustrates surface micromachined channels.
Figure 8:
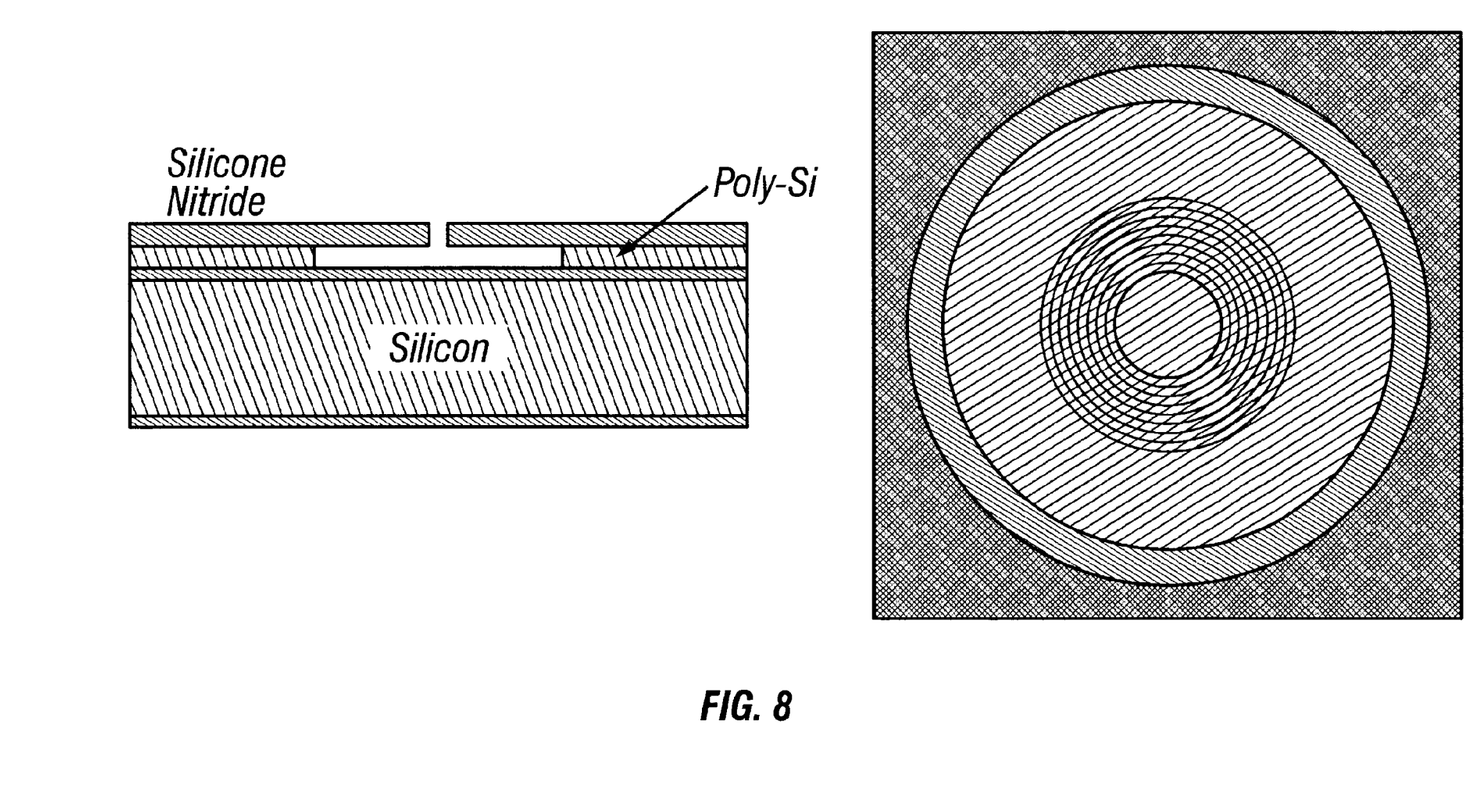
FIG. 8 illustrates surface micromachined membranes.
Figure 9:
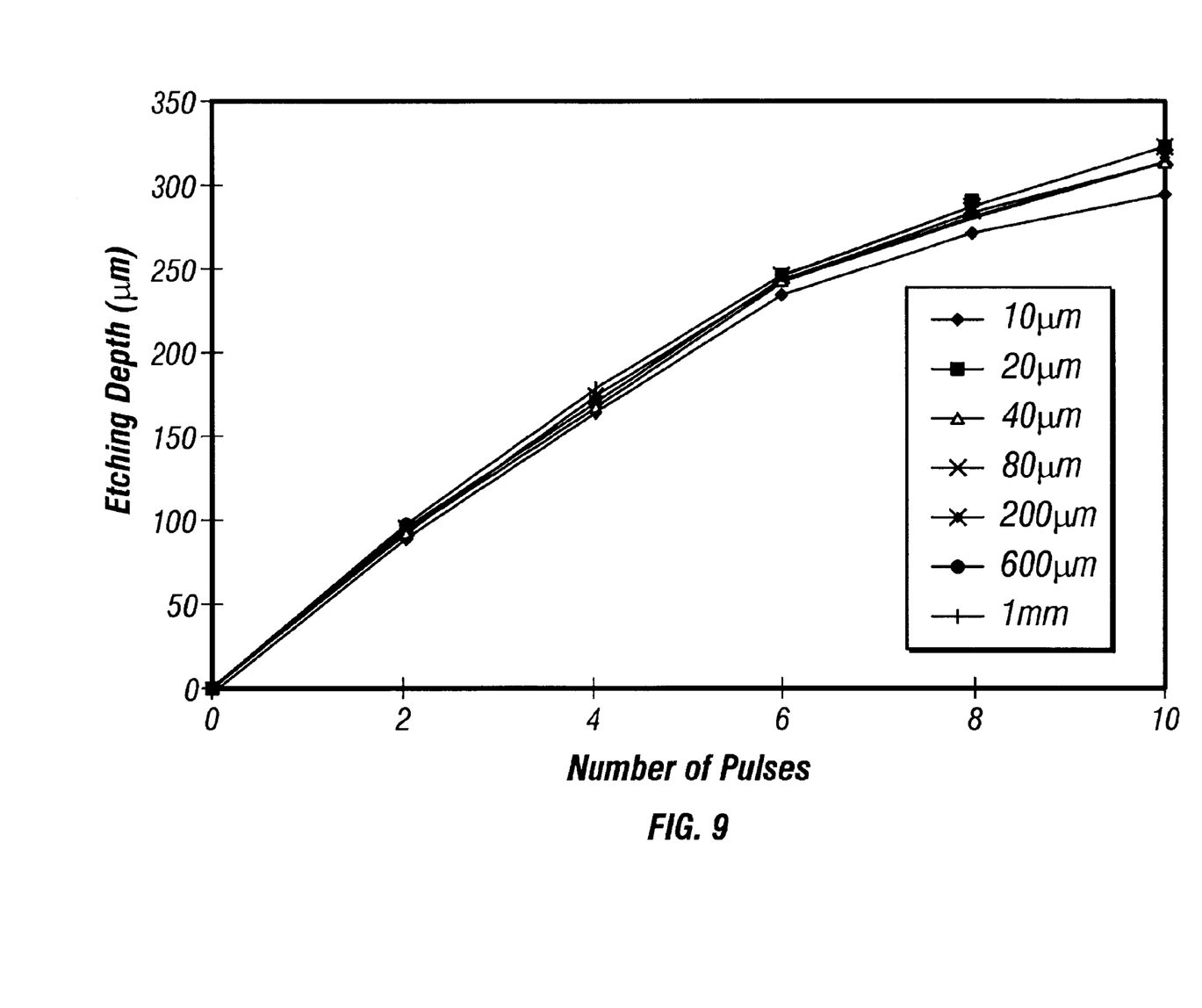
FIG. 9 illustrates etching length in surface micromachined channels vs. number of pulses.

As shown in FIG. 7 and FIG. 8, surface micromachined channels and membranes with silicon nitride as the structural layer and polysilicon as the sacrificial layer are also released by this $BrF_3$ etching process. FIG. 9 shows that no obvious etching rate difference is found among the channels with different widths. A total length of 300 $\mu$m has been etched into the channels with 10 etching pulses. Circular membranes have similar etching rates as the channels. The present invention provides an etch rate that is independent of the desired geometry of the sample.

Surface Roughing

Figure 10A:
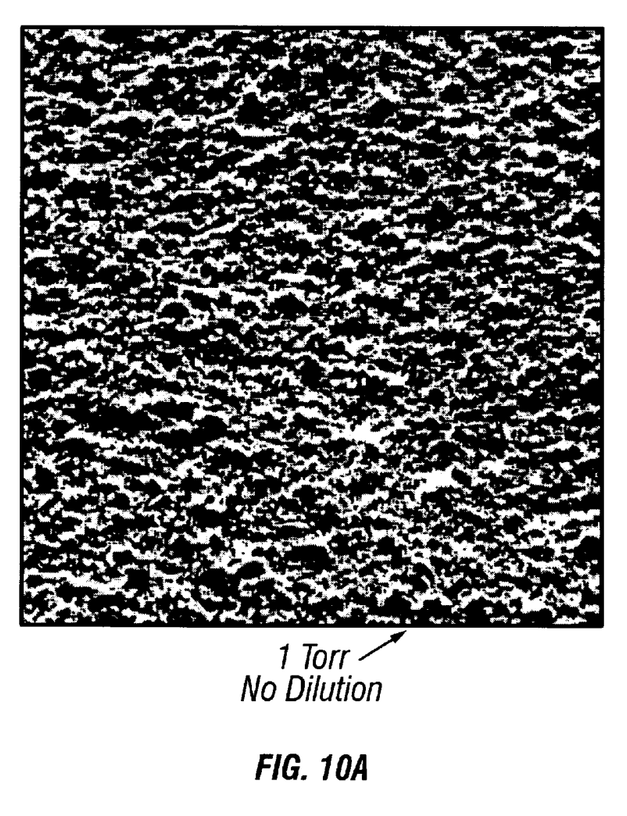
FIGS. 10A and 10B compares the effect of $BrF_3$ dilution on surface roughness.
Figure 10B:
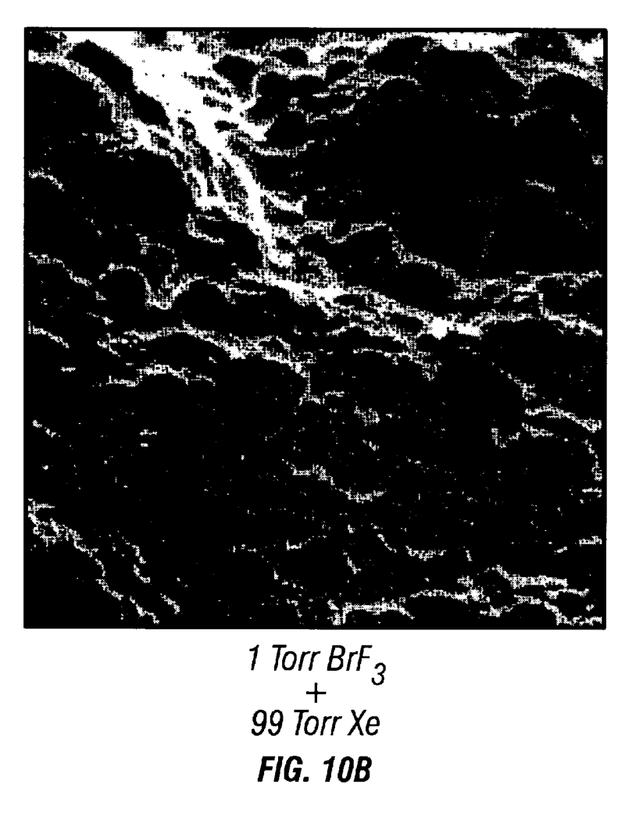

FIGS. 10A and 10B compare the effect of $BrF_3$ dilution on surface roughness. The inventors found that the silicon surface etched by pure $BrF_3$ at 1 Torr pressure is rather rough with about 2 $\mu$m roughness as shown in FIG. 10A. When 99 Torr of xenon (Xe) gas is added to the 1 Torr $BrF_3$, the $BrF_3$ molecules have a much shorter mean free path and are scattered more uniformly under the higher reaction press. This effect reduces the surface roughness to about 0.1 $\mu$m as shown in FIG. 10B.

Consistent etching results and high molecular etching efficiency (80%) have been achieved by performing the etching in a controlled pulse mode. This pure gaseous $BrF_3$ etching process is isotropic and has a high etch rate with high selectivity over silicon dioxide (3000:1), silicon nitride (400–800:1) and photoresist (1000:1). Gaseous $BrF_3$ etching can also be used in surface micromachining process, where silicon nitride channels and membranes using polysilicon as the sacrificial layer have been successfully fabricated. Gas-phase $BrF_3$ etching is simple, fast, maskable, and repeatable.

Although only a few embodiments have been described in detail above, those having ordinary skill in the art will certainly understand that many modifications are possible in the preferred embodiment without departing from the teachings thereof. For example, materials other than silicon can be etched in this way.

All such modifications are intended to be encompassed within the following claims.

What is claimed is:

1. A micromachining assembly, comprising:
   a first receptacle, storing $BrF_3$;

a second receptacle storing a xenon based dilution material for said $BrF_3$;

first and second mass flow controls, respectively controlling an amount of $BrF_3$ and xenon based dilution material, said first and second mass flow controls respectively being in series with said first and second receptacles; and a reaction device, receiving a gas phase material which comprises a desired combination of $BrF_3$ from said first receptacle and xenon based dilution material from said second receptacle.

2. An assembly as in claim 1, further comprising a mixing reservoir, receiving vapor phase $BrF_3$ from said first receptacle, and receiving vapor phase xenon based dilution material from said second receptacle, and holding with gases in said vapor phase.

3. An assembly as in claim 2, further comprising a pressure sensor, associated with said vapor reservoir, and measuring and maintaining a specified pressure therein.

4. An assembly as in claim 2, further comprising a corrosion resistant coating on at least said first receptacle inner surfaces, and said mixing reservoir.

5. An assembly as in claim 4, wherein said corrosion resistant coating comprises parylene polymer film.

6. An assembly as in claim 4 wherein said corrosion resistant coating comprises a material which increases a hydrophobicity.

7. An assembly as in claim 4, wherein said corrosion resistant coating comprises a polyimide organic material.

8. An assembly as in claim 2, wherein said xenon based dilution material includes a xenon gas.

9. A an assembly as in claim 2, wherein said the xenon based dilution material includes $XeF^2$.

10. An assembly as in claim 1, wherein said first receptacle stores liquid $BrF_3$.

11. An assembly as in claim 2, further comprising a chamber separation valve, between said mixing reservoir and said reaction chamber, which is opened to allow gas in said reaction chamber mixing reservoir to enter said reaction chamber.

12. A micromachined assembly, comprising:

a first receptacle, which is formed with inner surfaces that are corrosion resistant, and formed to store liquid phase BrF3, and storing said liquid phase $BrF_3$ therein;

a first valve, controlling delivery of said $BrF_3$;

a second receptacle, storing a xenon dilution gas therein;

a second valve, controlling delivery of said xenon dilution gas;

a mixing reservoir, coupled to outlet sides of said first and second valves, and formed with inner surfaces that are corrosion resistant, receiving gas phase $BrF_3$ and xenon dilution gas when said first and second valves are open;

a reaction chamber, adapted to store a semiconductor material therein, and to receive an etchant;

a chamber separation valve, coupled between an outlet of said mixing reservoir and said reaction chamber, and opening to allow mixed gas in said mixing reservoir into said reaction chamber; and a controller, controlling said valves such that said first and second valves are opened to allow specified amounts of gas to enter said mixing chamber, followed by said first and second valves being closed, and said chamber separation valve being opened to allow the specified amount of mixed vapor to enter said reaction chamber.

13. An assembly as in claim 12, wherein said controller control said valves to open for an amount of time to control and amount and concentration of $BrF_3$ etchant.

14. An assembly as in claim 12, wherein said controller allows the mixed etchant to remain in said reaction chamber for an amount of time that is effective to allow all of a gas phase etchants in said chamber to be mixed.

15. An assembly as in claim 12 wherein said first receptacle and said mixing reservoir have inner surfaces which are coated with parylene.

16. An assembly as in claim 12, wherein said first receptacle and said mixing reservoir have inner surfaces that are coated with an organic hydrophobicity increasing material.

17. An assembly as in claim 13, further comprising a pressure sensor associated with said mixing reservoir, an output of which is reported to said controller.

18. An assembly as in claim 17, wherein said pressure sensor is a pressure sensor which monitors capacitance changes.

19. An assembly as in claim 14, further comprising a pump, associated with said reaction chamber, and pumping said mixed etchant out of the reaction chamber after said amount of time.

20. An assembly as in claim 12, wherein said controller controls said valves to allow pulses of said BrF3 mixed with said xenon dilution gas to be applied to said reaction chamber.

21. An assembly as in claim 20, further comprising a vacuum pump, associated with said reaction chamber, and wherein said controller also controls said vacuum pump to end a specified pulse duration.

* * * * *